United States Patent [19]

Ipposhi et al.

[11] Patent Number: 5,471,086
[45] Date of Patent: Nov. 28, 1995

[54] SEMICONDUCTOR DEVICE HAVING PIEZO RESISTANCE

[75] Inventors: Takashi Ipposhi; Tadashi Nishimura, both of Hyogo, Japan

[73] Assignee: Mitsubishi Denki Kabushiki Kaisha, Tokyo, Japan

[21] Appl. No.: 332,623

[22] Filed: Oct. 31, 1992

Related U.S. Application Data

[63] Continuation of Ser. No. 127,540, Sep. 28, 1993, abandoned.

[30] Foreign Application Priority Data

Sep. 29, 1992 [JP] Japan ................... 4-259744

[51] Int. Cl.$^6$ ............ H01L 29/84; H01L 41/04; H01L 41/08
[52] U.S. Cl. ............ 257/417; 257/467; 257/418; 257/419; 73/727
[58] Field of Search ............ 73/517 R, 727; 257/536, 537, 419, 417, 418, 467, 469

[56] References Cited

U.S. PATENT DOCUMENTS

| | | | |
|---|---|---|---|
| 4,672,354 | 6/1987 | Kurtz et al. | 257/419 |
| 4,706,100 | 11/1987 | Tufte | 257/417 |
| 4,814,856 | 3/1989 | Kurtz et al. | 257/419 |
| 4,822,752 | 4/1989 | Sugahara et al. | 437/174 |
| 4,975,390 | 12/1990 | Fujii et al. | 257/419 |
| 5,177,661 | 1/1993 | Zavracky et al. | 361/283 |
| 5,336,918 | 8/1994 | Ipposhi et al. | 257/419 |

FOREIGN PATENT DOCUMENTS

| | | | |
|---|---|---|---|
| 2594546 | 9/1987 | France | 73/727 |
| 0002671 | 1/1981 | Japan | 257/419 |
| 0079778 | 5/1985 | Japan | 257/419 |
| 0018072 | 1/1987 | Japan . | |
| 0076484 | 4/1988 | Japan . | |
| 0076959 | 3/1992 | Japan . | |
| 2207804 | 2/1989 | United Kingdom | 73/727 |

*Primary Examiner*—William Mintel
*Assistant Examiner*—Peter Toby Brown
*Attorney, Agent, or Firm*—Lowe, Price, LeBlanc & Becker

[57] ABSTRACT

Disclosed herein a semiconductor pressure sensor, which is capable of carrying out temperature compensation in high accuracy, having a piezo resistance layer consisting of a single crystal layer formed by lateral seeding. In this semiconductor pressure sensor, a piezo resistance is so formed as to contain no crystal sub-grain boundary. Thus prevented is inconvenience of reduction in resistance temperature coefficient, which is caused when the piezo resistance contains the crystal sub-grain boundary. Thus, the piezo resistance can be set at a high resistance temperature coefficient, whereby a semiconductor pressure sensor capable of carrying out temperature compensation in high accuracy is obtained.

11 Claims, 11 Drawing Sheets

SEMICONDUCTOR DEVICE HAVING PIEZO RESISTANCE

This application is a continuation of application Ser. No. 08/127,540 filed Sep. 28, 1993, now abandoned.

BACKGROUND OF THE INVENTION

1. Field of the Invention

The present invention relates to a semiconductor device and a method of fabricating the same, and more particularly, it relates to a semiconductor device having an SOI (silicon on insulator) structure which is formed by laterally growing single crystals from seed crystals on an insulating film, and a method of fabricating the same.

2. Description of the Background Art

Generally known is a semiconductor pressure sensor or a semiconductor acceleration sensor having an SOI structure, which is obtained by laterally growing single crystals from seed crystals on an insulating film for forming a single crystal layer and preparing a pressure-sensitive resistances (piezo resistances) having piezo characteristics from the single crystal layer. A conventional semiconductor pressure or acceleration sensor having such an SOI structure can operate under a high temperature since no p-n junctions are employed for electrically isolating the piezo resistances from each other and from a single crystal silicon substrate. The method of forming a single crystal layer of the SOI structure by laterally growing single crystals from seed crystals on an insulating film is called lateral seeding. As a method of such lateral seeding, known is laser recrystallization of irradiating a non-single crystal silicon layer which is formed on an insulating film with a laser beam for melting and resolidifying the same. Such laser recrystallization is widely employed since it is possible to form a high quality SOI structure at a low cost and a laser recrystallization apparatus is easy to handle. In order to form a single crystal semiconductor layer by laser recrystallization, it is necessary to cause recrystallization from seed crystal regions by controlling temperature distribution in the melted semiconductor material. Namely, crystallization progresses from low temperature regions toward high temperature parts in the melted silicon, and hence it is necessary to control temperature distribution so that the seed crystal regions are at low temperatures. A method using antireflection films is known as a method of controlling such temperature distribution, as described in detail in U.S. Pat. No. 4,822,752, for example.

FIG. 12 is a fragmented perspective view for illustrating a conventional laser recrystallization method using antireflection films. FIGS. 13 and 14 are sectional views for illustrating first and second steps of the conventional laser recrystallization method using antireflection films. FIG. 15 is a fragmented perspective view for illustrating a third step of the conventional laser recrystallization method using antireflection films. With reference to FIGS. 12 to 15, the conventional laser crystallization method using antireflection films is now described.

First, an insulating layer 102 of a silicon oxide film is formed on a surface of a single crystal silicon substrate 101, as shown in FIG. 12. This insulating layer 102 is provided in its prescribed regions with openings 15, which define seed portions. A non-single crystal semiconductor layer (polycrystalline silicon layer) 113 is formed on a surface of the insulating layer 102, and partially in the openings 105. Antireflection films 105 of prescribed shapes are formed on a surface of the polycrystalline silicon layer 113. These antireflection films 104 are formed by silicon nitride films ($Si_3N_4$), for example. The antireflection films 104 are formed on positions separated from the openings 15, which are provided in the insulating layer 102, at substantially equal spaces. In order to suppress deformation of the surfaces during recrystallization, a thin cap film may be formed over the entire surfaces of the polycrystalline silicon layer 113 and the antireflection films 104. The openings 105 are filled up with parts of the polycrystalline silicon layer 113, which is made of a non-single crystal semiconductor material. Therefore, the crystal orientation of the polycrystalline silicon layer 113 to be recrystallized is controlled along that of the single crystal silicon substrate 101. Reflection factors of the silicon nitride films forming the antireflection films 104 periodically exhibit maximum values and zero depending on thicknesses thereof. In consideration of such properties, silicon nitride films having thicknesses zeroing reflection factors are employed as the antireflection films 104. According to this example, the antireflection films 104 are prepared from silicon nitride films having thicknesses of about 600 Å.

Then, the overall surface of the polycrystalline silicon layer 113 is irradiated with a laser beam 170, as shown in FIG. 13. The antireflection films 104 selectively formed on the surface of the polycrystalline silicon layer 113 have reflection factors of zero with respect to the laser beam 170. This means that the antireflection films 104 absorb substantially all incident light. On the other hand, regions provided with no antireflection films 104, i.e., those partially exposing the surface of the polycrystalline silicon layer 113, have reflection factors of about 40% with respect to the laser beam 170. Thus, the laser beam 170 which is applied to the overall surface of the polycrystalline silicon layer 113 is greatly absorbed in portions located under the antireflection films 104, to heat such regions to higher temperatures. The laser beam 170 has a wavelength of 488 nm and a beam diameter of about 120 to 180 µm. The insulating film 102 is formed by a silicon oxide film having a thickness of 1 to 3 µm, while the polycrystalline silicon layer 113, serving as a non-single crystal semiconductor layer, has a thickness of about 0.6 µm. The antireflection films 104, which are about 5 µm in width, are at positional spaces of about 15 µm. The laser beam 170 which is applied onto the surface of the polycrystalline silicon layer 113 moves at a constant speed. The polycrystalline silicon layer 113 irradiated with the laser beam 170 is increased in temperature and melted. FIG. 16 is a temperature distribution diagram showing relations between surface positions and internal temperatures of the polycrystalline silicon layer 113. Referring to FIG. 16, it is understood that the polycrystalline silicon layer 113 has higher internal temperatures in the portions located under the antireflection films 104. In other words, the polycrystalline silicon layer 113 has lower internal temperatures in portions close to the openings 105.

After passage of the laser beam 170, the melted polycrystalline silicon layer 113 is cooled, as shown in FIG. 14. Thus, the temperatures of the melted polycrystalline silicon layer 113 start lowering, to be recrystallized (solidified) from regions having lower temperatures. As understood from the temperature distribution shown in FIG. 16, the polycrystalline silicon layer 113 has lower inner temperatures in the portions close to the openings 105. In this cooling process, therefore, the portions of the polycrystalline silicon layer 113 which are filled up in the openings 105 define seed portions 106. Thus, recrystallization of the polycrystalline silicon layer 113 is started from the seed portions 106. The seed portions 106 are connected with the single crystal silicon substrate 101. Therefore, single crystal silicon regions 103a having the same crystal orientation as the single crystal silicon substrate 101 spread from the seed portions 106, serving as start points, around the same.

Then, the completely recrystallized polycrystalline silicon layer 113 is converted to a homogeneous single crystal silicon layer 103, as shown in FIG. 15. Thereafter the antireflection films 104 are removed.

In the aforementioned formation of the single crystal silicon layer 103, recrystallization of the polycrystalline silicon layer 113 starts from the seed portions 106 located between the antireflection films 104 to progress toward the portions, which are at higher temperatures, located under the antireflection films 104. Therefore, crystals grown from both sides of the antireflection films 104 collide with each other in the portions located under the antireflection films 104. Consequently, crystal sub-grain boundaries 150 are defined in positions of such collision of the as-grown crystals. Namely, portions of the single crystal silicon layer 103 which are adjacent to each other through the antireflection films 104 are grown independently of each other, and hence such portions slightly deviate in crystal orientation from each other. As the result, the crystal sub-grain boundaries 150 are defined between such portions.

In the aforementioned laser recrystallization using the antireflection films 104, a single crystal silicon substrate having a major surface of a (100) plane is generally employed so that the stripes of the antireflection films 104 are provided along the <100> direction. In this case, the crystal sub-grain boundaries 150 are defined along the <100> direction, similarly to the stripes of the antireflection films 104.

It has been recognized that piezoresistance effects of piezo resistances, which are formed by regions including such crystal sub-grain boundaries 150 of a single crystal layer, are hardly influenced by the crystal sub-grain boundaries 150 since crystal defects contained therein are of the order of $10^{11}$ cm$^{-2}$ in density. In other words, it has been recognized in practice that piezo resistances having crystal sub-grain boundaries therein exhibit piezoresistance effects which are equivalent to those of piezo resistances which are prepared from bulk single crystal silicon.

FIG. 17 is a plan view showing a conventional semiconductor pressure sensor employing piezo resistances having SOI structures, and FIG. 18 is a sectional view of the semiconductor pressure sensor taken along the line X—X in FIG. 17. FIG. 19 is a partially enlarged view showing a part A of the semiconductor pressure sensor appearing in FIG. 17. Referring to FIGS. 17 to 19, the conventional semiconductor pressure sensor comprises a single crystal silicon substrate 201, a diaphragm 208 which is formed in a prescribed region of a rear surface of the single crystal silicon substrate 201, a silicon oxide film 202 which is formed on a prescribed region of a major surface of the single crystal silicon substrate 201, dot seeds 203 which are formed on regions, provided with no silicon oxide film 202, of the major surface of the single crystal silicon substrate 201 at prescribed intervals for serving as seed crystals, piezo resistances 204 of single crystal silicon having piezo characteristics which are formed on prescribed regions of the silicon oxide film 202, an interlayer insulating film 205 of a CVD silicon oxide film which is formed to cover the single crystal silicon substrate 201 and the piezo resistances 204 with contact holes 206 provided in prescribed regions located on the piezo resistances 204, interconnection layers 207 which are electrically connected to the piezo resistances 204 through the contact holes 206 to extend along the interlayer insulating film 205, and a protective film 209 of a plasma nitride film or a silicon oxide film which is formed to cover the interconnection layers 207 and the interlayer insulating film 205. The piezo resistances 204 having conventional SOI structures, which are formed by lateral seeding, have crystal sub-grain boundaries 250 therein. However, it has been confirmed in practice that the piezo resistances 204 having such crystal sub-grain boundaries 250 therein exhibit piezoresistance effects which are equivalent to those of piezo resistances prepared from bulk single crystal silicon, as hereinabove described.

In employment of the conventional semiconductor pressure sensor shown in FIGS. 17 to 19, it is necessary to perform output compensation with respect to its operating temperature. Namely, output compensation which is responsive to the operating temperature is required due to temperature dependence of piezoresistance effects. Excitation voltage compensation utilizing resistance temperature characteristics of the piezo resistances 204 is known as a method of such output compensation. Such excitation voltage compensation enables output compensation of high accuracy since the piezo resistances 204 also serve as temperature sensors. Therefore, the excitation voltage compensation is regarded as the best method of compensating temperature dependence of piezoresistance effects.

In the aforementioned output compensation utilizing the resistance temperature characteristics of the piezo resistances 204, it is necessary to make resistance temperature coefficients of the piezo resistances 204 higher than temperature coefficients of the piezoresistance effects. In a conventional piezo resistance which was prepared from bulk single crystal silicon, the temperature coefficient of its piezoresistance effect was about 2000 ppm/°C. when impurity concentration of the piezo resistance was about $3\times10^{18}$ cm$^{-3}$. The piezo resistance exhibited a resistance temperature coefficient of about 4000 ppm/°C. under the same condition. On the other hand, it has been proved that each of the piezo resistances 204 having SOI structures shown in FIGS. 17 to 19 had a considerably small resistance temperature coefficient of 1000 ppm/°C. while the temperature coefficient of its piezoresistance effect was equivalent (about 2000 ppm/°C.) to that of the aforementioned piezo resistance of bulk single crystal silicon. It has also been proved that the piezo resistance 204 of an SOI structure exhibited such a small resistance temperature coefficient due to crystal defects contained in the crystal sub-grain boundaries 250. Such crystal defects capture conduction carriers (electrons or holes) which are supplied by addition of an impurity, to form potential barriers. Due to such potential barriers, electric conduction of the piezo resistance 204 depends on a thermal emission current. Thus, changes of the resistance value of the piezo resistance 204 with respect to temperatures are decided by values of the potential barriers. Thus, the changes of the resistance value of the piezo resistance 204 with respect to temperatures are smaller than those of the piezo resistance prepared from bulk silicon. The resistance temperature coefficient of the piezo resistance 204 having the crystal sub-grain boundaries 250 therein inconceivably rendered smaller than that of the piezo resistance prepared from bulk single crystal silicon as the result. In the conventional piezo resistance 204 having an SOI structure, therefore, it is difficult to carry out temperature compensation in high accuracy by the excitation voltage compensation since the resistance temperature coefficient of the piezo resistance 204 is smaller than the temperature coefficient of its piezoresistance effect.

It is known that a piezoresistance effect of a piezo resistance which is prepared from silicon single crystal depends on its impurity concentration. In other words, it is known that the piezoresistance effect is increased as the impurity concentration is reduced when the piezo resistance has impurity concentration of at least $10^{17}$ cm$^{-3}$. When each of the piezo resistances 204 shown in FIGS. 17 to 19 is prepared from single crystal silicon which is formed by laser recrystallization, its piezoresistance effect is increased as impurity concentration thereof is reduced. However, such reduction in impurity concentration of the piezo resistance 204 leads to increase in dispersion of the resistances value in the wafer plane. Such dispersion of the resistance value results from heterogeneity of crystal defects, contained in the crystal sub-grain boundaries 250, which are of the order of $10^{11}$ cm$^{-2}$ in density. Namely, the crystal defects contained in the crystal sub-grain boundaries 250 capture conduction carriers(electrons or holes) which are supplied by addition of an impurity, to form potential barriers. Such potential barriers are increased as the piezo resistance 204 is reduced in impurity concentration. Such increased potential barriers are largely dispersed due to dispersion of the crystal defects in density. It is conceivable that the dispersion of the resistance value of the piezo resistance is consequently increased as the impurity concentration is reduced. In the conventional piezo resistance of an SOI structure, therefore, it is difficult to increase the piezoresistance effect while suppressing dispersion of the resistance value.

SUMMARY OF THE INVENTION

An object of the present invention is to enable temperature compensation of high accuracy in a semiconductor device also when a piezo resistance is formed by a single crystal silicon layer of an SOI structure.

Another object of the present invention is to increase a piezoresistance effect in a semiconductor device while suppressing dispersion in resistance value of a piezo resistance to some extent.

Still another object of the present invention is to provide a method of fabricating a semiconductor device which can easily fabricate a semiconductor device, being capable of carrying out temperature compensation in high accuracy, also when a piezo resistance is formed by a single crystal silicon layer of an SOI structure.

A semiconductor device according to a first aspect of the present invention comprises a single crystal semiconductor substrate having a seed crystal region, an insulating layer which is formed on the single crystal semiconductor substrate, and a piezo resistance layer having piezo characteristics, which consists of a single crystal layer formed by laterally growing seed crystals from the seed crystal region on the insulating layer. The piezo resistance layer is so formed as to contain no crystal sub-grain boundary region therein.

In operation, the piezo resistance layer is so formed as to contain no crystal sub-grain boundary therein, whereby the resistance temperature coefficient of the piezo resistance layer is so increased that temperature compensation is carried out in high accuracy also when the piezo resistance layer is formed by a single crystal silicon layer of an SOI structure.

A semiconductor device according to another aspect of the present invention comprises a single crystal semiconductor substrate having a seed crystal region, an insulating layer which is formed on the single crystal semiconductor substrate, and a piezo resistance layer having piezo characteristics, which consists of a single crystal layer formed by laterally growing single crystals from the seed crystal region on the insulating layer. The piezo resistance layer is so formed that a crystal sub-grain boundary is provided therein while its current path will not traverse the crystal sub-grain boundary.

In operation, electric conduction in the piezo resistance layer is effectively prevented from inhibition by a potential barrier since the piezo resistance layer is so formed that a crystal sub-grain boundary is provided therein while its current path will not traverse the crystal sub-grain boundary. Thus, the resistance temperature coefficient of the piezo resistance layer is so increased as to enable temperature compensation of high accuracy, also when the piezo resistance layer is formed by a single crystal silicon layer of an SOI structure.

A semiconductor device according to still another aspect of the present invention comprises a single crystal semiconductor substrate having a seed crystal region, an insulating layer which is formed on the single crystal semiconductor substrate, and a piezo resistance layer having piezo characteristics, which consists of a single crystal layer formed by laterally growing single crystals from the seed crystal region on the insulating layer. The piezo resistance layer has a crystal sub-grain boundary therein, while impurity concentration thereof is set to be at least $4 \times 10^{17}$ cm$^{-3}$.

In operation, a piezoresistance effect is increased with dispersion in resistance value of the piezo resistance layer being suppressed to some extent, since the piezo resistance layer has a crystal sub-grain boundary therein while its impurity concentration is set to be at least $4 \times 10^{17}$ cm$^{-3}$.

A method of fabricating a semiconductor device according to a further aspect of the present invention comprises a step of forming an insulating layer on a single crystal semiconductor substrate having a seed crystal region, a step of forming a single crystal layer by laterally growing single crystals from the seed crystal region on the insulating layer, and a step of forming a piezo resistance layer on a region of the single crystal layer containing no crystal sub-grain boundary.

In operation, the resistance temperature coefficient of the piezo resistance layer is not reduced even if the same is formed by a single crystal layer of an SOI structure, since the piezo resistance layer is formed on a region, containing no crystal sub-grain boundary, of the single crystal layer which is formed on the insulating layer. Thus, the piezo resistance layer can be set at a high resistance temperature coefficient, to enable temperature compensation in high accuracy.

A method of fabricating a semiconductor device according to a further aspect of the present invention comprises a step of forming an insulating layer on a single crystal semiconductor substrate having a seed crystal region, a step of forming a single crystal layer by laterally growing single crystals from the seed crystal region on the insulating layer, and a step of forming a piezo resistance layer on a region of the single crystal layer containing a crystal sub-grain boundary so that the crystal sub-grain boundary will not traverse its current path.

In operation, electric conduction of the piezo resistance layer is effectively prevented from inhibition by a potential barrier which is formed therein and the piezo resistance layer is prevented from reduction in resistance temperature coefficient since the piezo resistance layer is formed in a region of the single crystal layer containing a crystal sub-grain boundary so that the crystal sub-grain boundary will not traverse its current path. Thus, it is possible to set the piezo resistance layer at a high resistance temperature coefficient, whereby a semiconductor device which is capable of carrying out temperature compensation in high accuracy is easily fabricated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the accompanying drawings.

Figure 1:
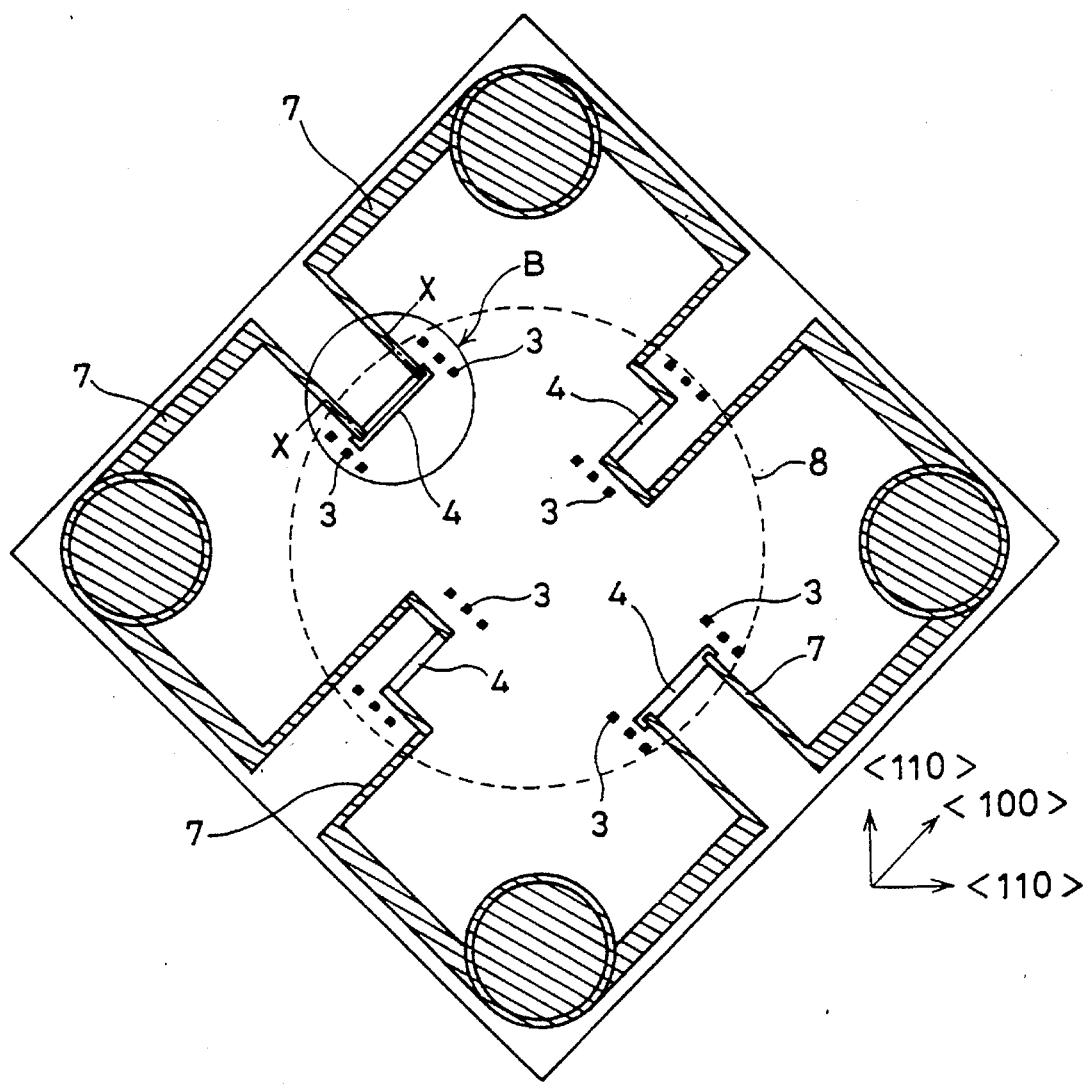
FIG. 1 is a plan view showing a semiconductor pressure sensor having an SOI structure according to a first embodiment of the present invention.
Figure 2:
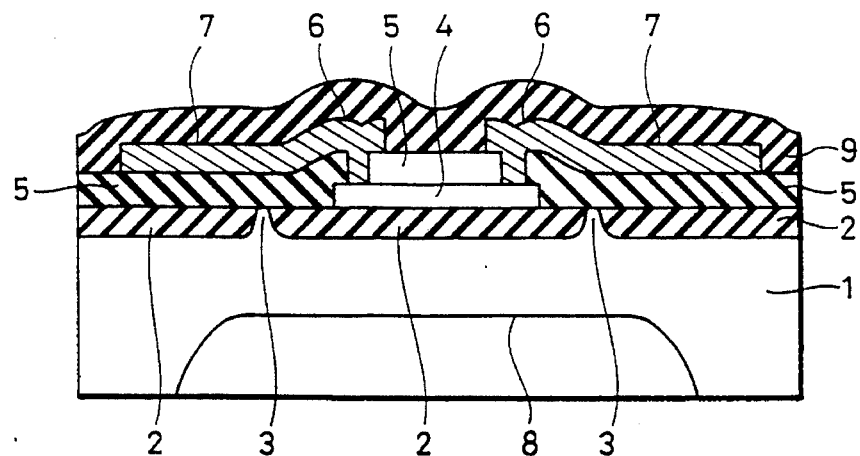
FIG. 2 is a sectional view of the semiconductor pressure sensor according to the first embodiment of the present invention, taken along the line X—X in FIG. 1.
Figure 3:
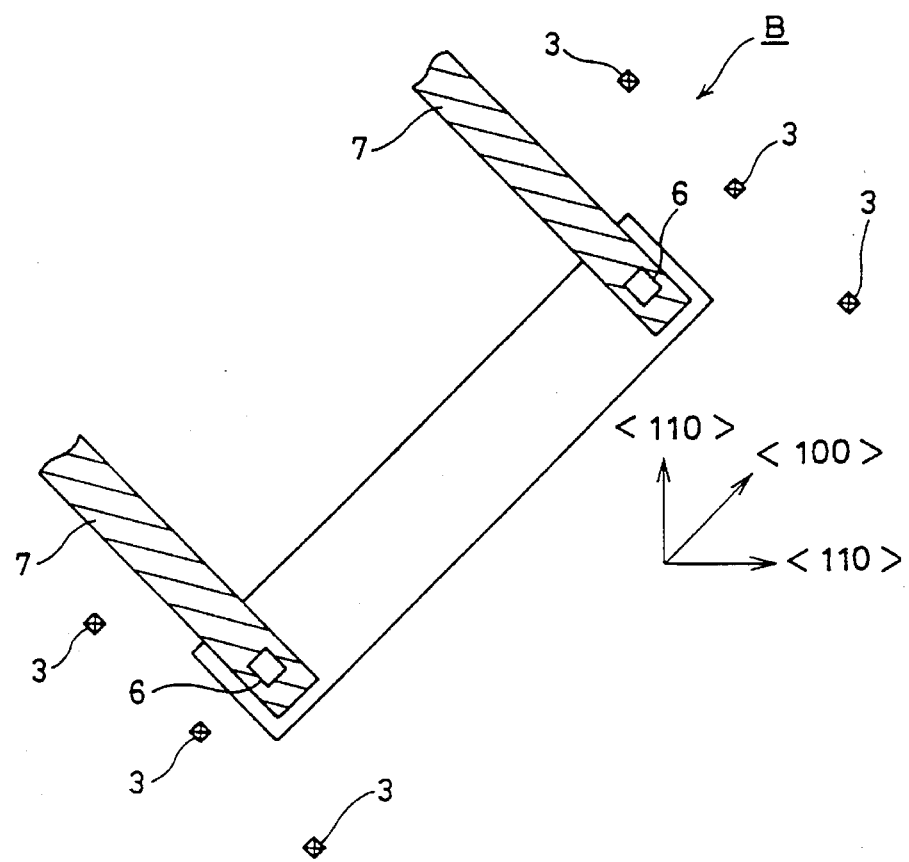
FIG. 3 is a partially enlarged view showing a portion B of the semiconductor pressure sensor according to the first embodiment appearing in FIG. 1.
Figure 17:
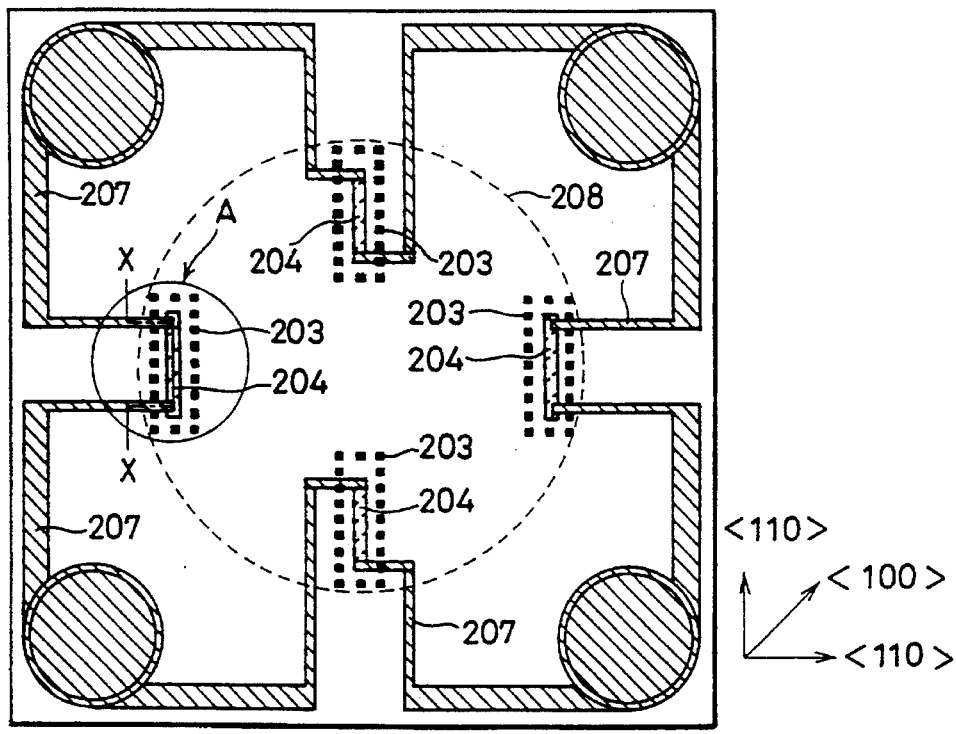
FIG. 17 is a plan view showing a conventional semiconductor pressure sensor utilizing piezo resistances of SOI structures.
Figure 18:
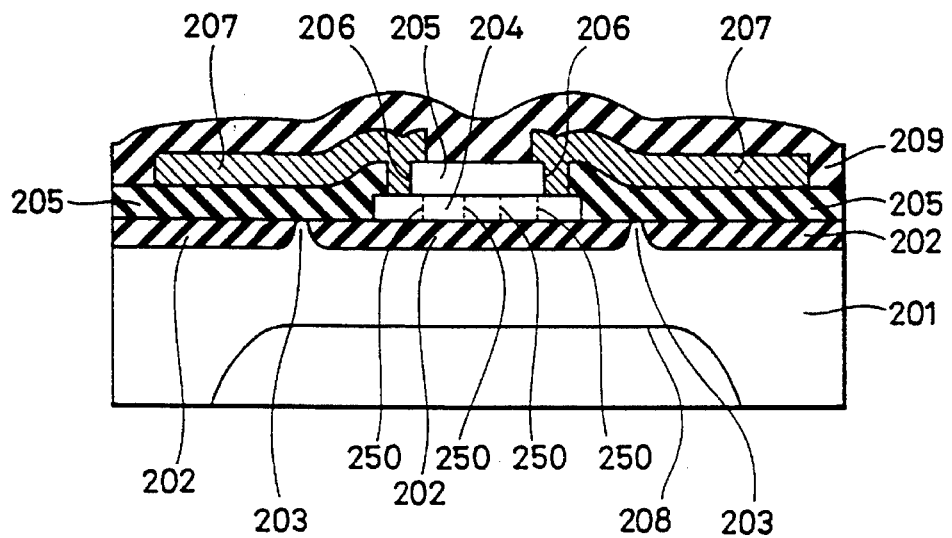
FIG. 18 is a sectional view of the semiconductor pressure sensor, taken along the line X—X in FIG. 17.
Figure 19:
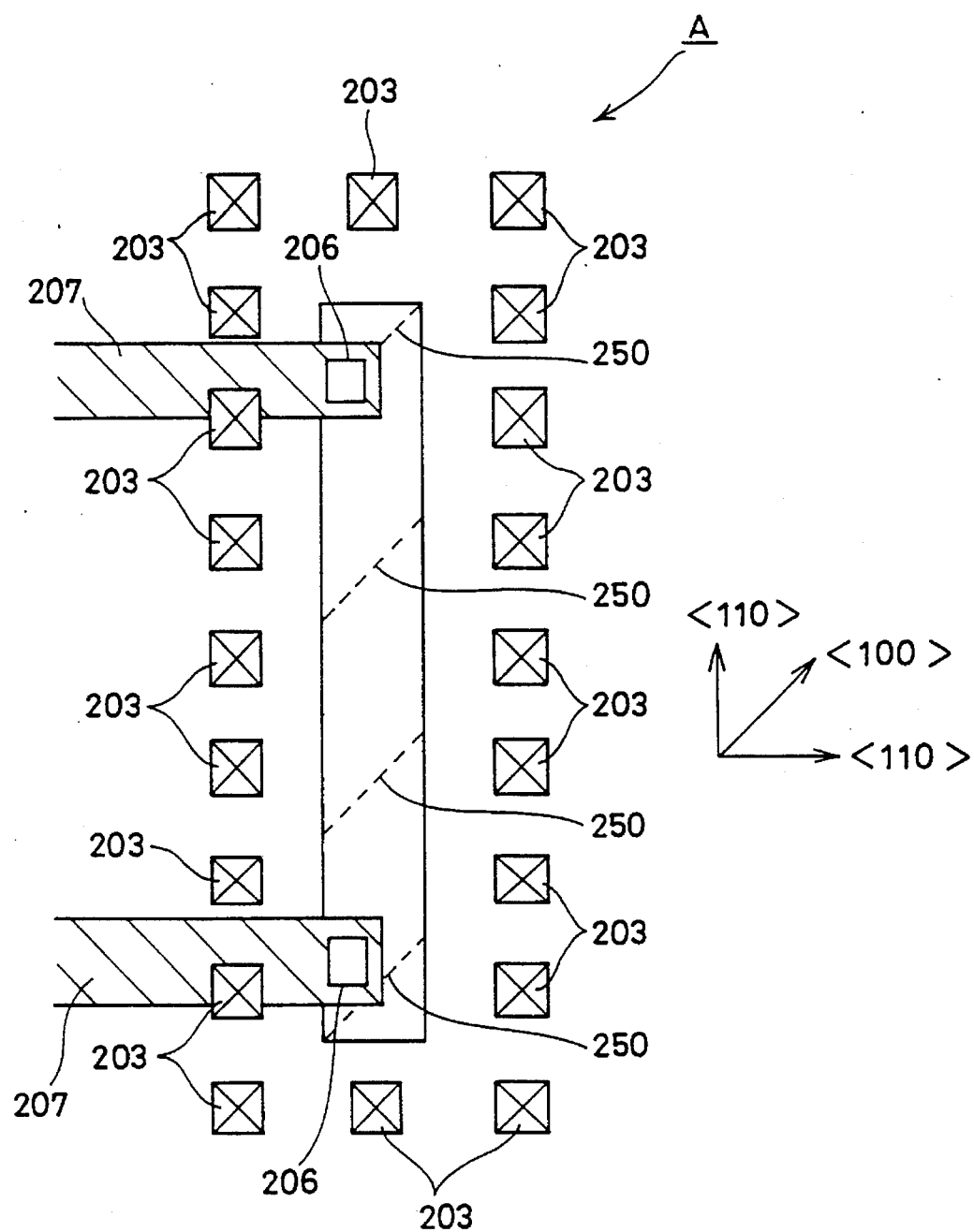
FIG. 19 is a partially enlarged view of a portion A of the semiconductor pressure sensor appearing in FIG. 17.

Referring to FIGS. 1 to 3, a semiconductor pressure sensor according to a first embodiment of the present invention comprises a single crystal silicon substrate 1, a diaphragm 8 which is formed in a prescribed region of a rear surface of the single crystal silicon substrate 1, a silicon oxide film 2 which is formed on a prescribed region of a major surface of the single crystal silicon substrate 1, dot seeds 3 which are formed on regions, provided with no silicon oxide film 2, of the major surface of the single crystal silicon substrate 1 at prescribed intervals for serving as seed crystals, piezo resistances 4 of single crystal silicon having piezo characteristics which are formed on prescribed regions of the silicon oxide film 2, an interlayer insulating film 5 of a CVD silicon oxide film which is formed to cover the single crystal silicon substrate 1 and the piezo resistances 4 with contact holes 6 provided in prescribed regions located on the piezo resistances 4, interconnection layers 7 which are electrically connected to the piezo resistances 4 through the contact holes 6 to extend along the interlayer insulating film 5, and a protective film 9 of a plasma nitride film or a silicon oxide film which is formed to cover the interconnection layers 7 and the interlayer insulating film 5. According to this embodiment, the piezo resistances 4 have no crystal sub-grain boundaries, dissimilarly to the conventional semiconductor pressure sensor shown in FIGS. 17 to 19. Since the piezo resistances 4 are so formed as to have no crystal sub-grain boundaries, resistance temperature coefficients thereof are not reduced dissimilarly to the conventional semiconductor pressure sensor shown in FIGS. 17 to 19. Thus, the piezo resistances 4 can be set at high temperature coefficients, to enable temperature compensation of high accuracy by excitation voltage compensation.

Figure 4:
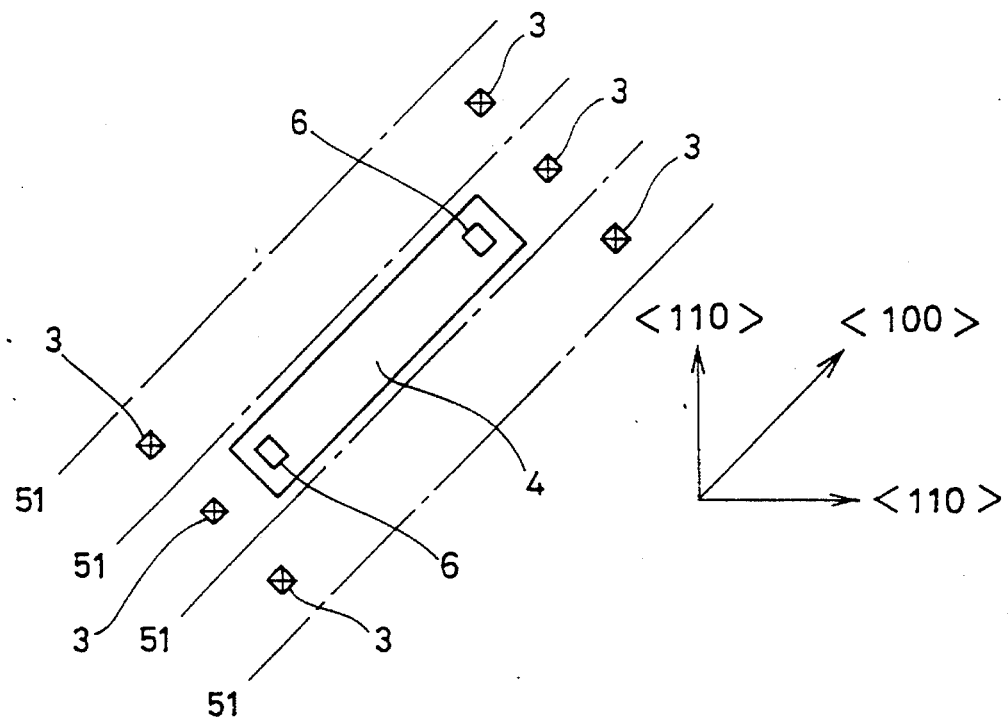
FIG. 4 is a plan view for illustrating a method of preparing a piezo resistance of the semiconductor pressure sensor according to the first embodiment shown in FIGS. 1 to 3.

In a method of preparing each piezo resistance of the semiconductor pressure sensor according to the first embodiment, a single crystal silicon layer (not shown) is first formed by the laser recrystallization, which is described above with reference to FIGS. 12 to 16, as shown in FIG. 4. Crystal sub-grain boundaries 51 are formed in this single crystal layer, to extend along a prescribed direction. In the semiconductor pressure sensor according to the first embodiment, each piezo resistance 4 is formed on a region of the single crystal layer provided with no crystal sub-grain boundaries 51. In the general laser recrystallization, the single crystal silicon substrate 1 is prepared from that of a (100) plane, and antireflection film stripes (not shown) are formed along the <100> direction. In this case, the crystal sub-grain boundaries 51 are formed along the <100> direction, similarly to the antireflection film stripes. Therefore, the piezo resistance 4 can be easily formed between an adjacent pair of crystal sub-grain boundaries 51 extending along the <100> direction, so that the same includes no crystal sub-grain boundaries 51. In the piezo resistance 4 according to the first embodiment of the present invention, a current flows across the two contact holes 6 along the <100> direction. In other words, the current direction of the piezo resistance 4 is substantially parallel to the direction of the crystal sub-grain boundaries 51 according to the first embodiment. As to the dot-seeds 3, one such dot seed 3 may be formed only on one side of a region for forming the piezo resistance 4 at the minimum. Namely, when the laser beam is applied in one scanning direction, a single dot seed 3 may be provided only on one side of the region for forming the piezo resistance 4. In the semiconductor pressure sensor according to the first embodiment shown in. FIG. 1 having four piezo resistances 4, single dot seeds 3 are provided on the same sides of the piezo resistances 4 at the minimum.

Figure 5:
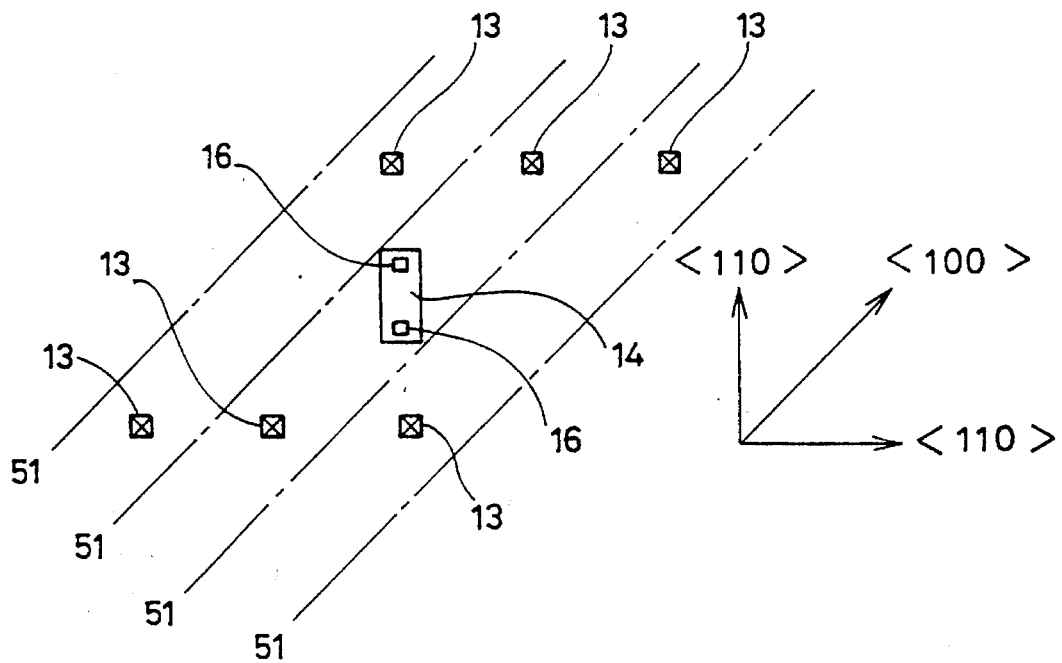
FIG. 5 is a plan view for illustrating a method of sensor having an SOI structure according to a second embodiment of the present invention.

According to a second embodiment of the present invention, a piezo resistance 14 is so formed as to include no crystal sub-grain boundaries 51 as shown in FIG. 5, similarly to the first embodiment. According to the second embodiment, however, the piezo resistance 14 is so formed that its current direction is inclined by about 45° as to the direction of the crystal sub-grain boundaries 51, dissimilarly to the first embodiment. Piezoresistance effects of n-type silicon and p-type silicon are maximized in different crystal orientations. In n-type silicon of a (100) plane, its piezoresistance effect is maximized when a current flows along the <100> direction. In p-type silicon of a (100) plane, on the other hand, its piezoresistance effect is maximized when a current flows along the <110> direction. Therefore, boron may be added to the piezo resistance 14 according to the second embodiment, in which the current flows across the two contact holes 16 along the <110> direction as shown in FIG. 5, in order to convert the same to p-type silicon. In the first embodiment shown in FIG. 4, on the other hand, an n-type impurity such as phosphorus or arsenic may be added to the piezo resistance 4, in which the current flows along the <100> direction, in order to convert the same to n-type silicon.

Antireflection films may be formed along the <110> direction to carry out laser recrystallization. In this case, crystal sub-grain boundaries are also formed along the <110> direction. Also in this case, the relation between the conductivity type and the current direction of the as-formed piezo resistance and the maximum value of its piezoresistance effect is identical to the above. Namely, the piezoresistance effects of n-type silicon and p-type silicon are maximized when currents flow along the <100> and <110> directions respectively.

Figure 6:
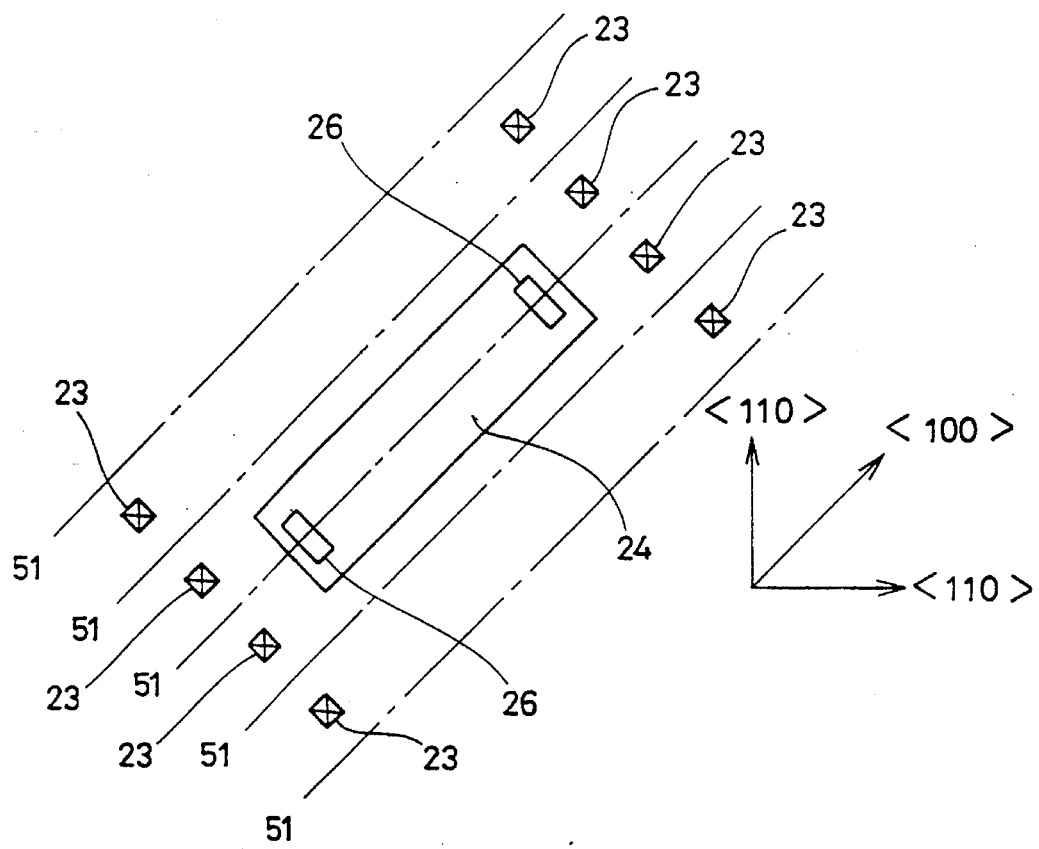
FIG. 6 is a plan view for illustrating a method of preparing piezo resistance of a semiconductor pressure sensor having an SOI structure according to a third embodiment of the present invention.

According to a third embodiment of the present invention, a crystal sub-grain boundary 51 is contained in a piezo resistance 24, as shown in FIG. 6. However, this piezo resistance 24 is so formed that a current path connecting two contact holes 26 with each other will not traverse the crystal sub-grain boundary 51. Thus, it is possible to effectively prevent electric conduction of the piezo resistance 24 from inhibition by a potential barrier formed by the crystal sub-grain boundary 51. Consequently, the piezo resistance 24 can be set at a high resistance temperature coefficient, whereby it is possible to carry out temperature compensation in high accuracy by excitation voltage compensation. According to the third embodiment, the current flows along the <100> direction in the piezo resistance 24. Therefore, an n-type impurity such as phosphorus or arsenic may be introduced into the piezo resistance 24 in order to convert the same to n-type silicon, similarly to the first embodiment shown in FIG. 1. Thus, the piezoresistance effect can be maximized.

Figure 7:
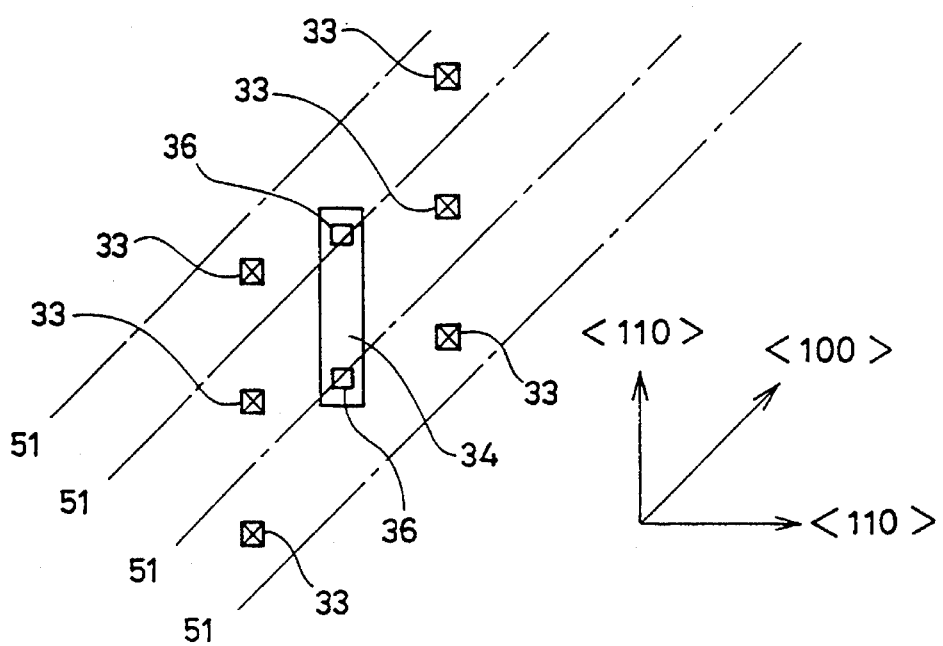
FIG. 7 is a plan view for illustrating a method of preparing a piezo resistance of a semiconductor pressure sensor having an SOI structure according to a fourth embodiment of the present invention.
Figure 8:
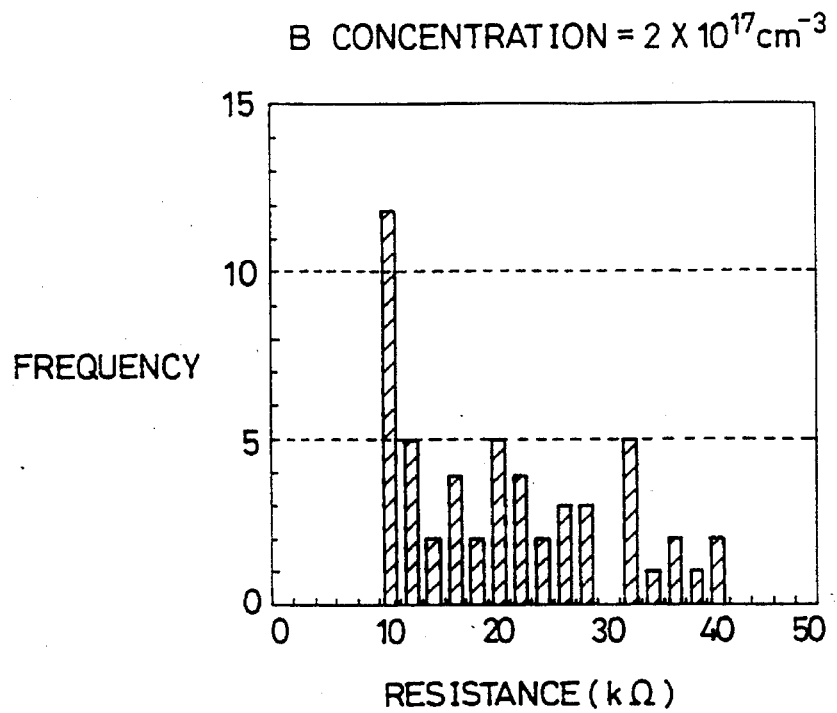
FIG. 8 is a distribution diagram showing distribution in resistance value of a piezo resistance, having crystal sub-grain boundaries therein, with impurity concentration of $2 \times 10^{17}$ cm$^{-3}$.
Figure 9:
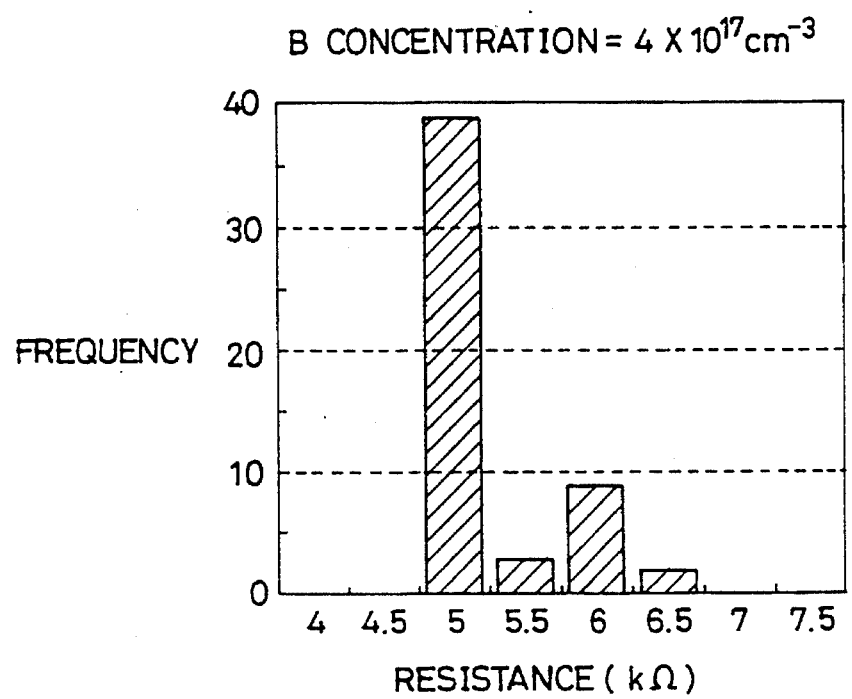
FIG. 9 is a distribution diagram showing distribution in resistance value of a piezo resistance, having crystal sub-grain boundaries therein, with impurity concentration of $4 \times 10^{17}$ cm$^{-3}$.
Figure 10:
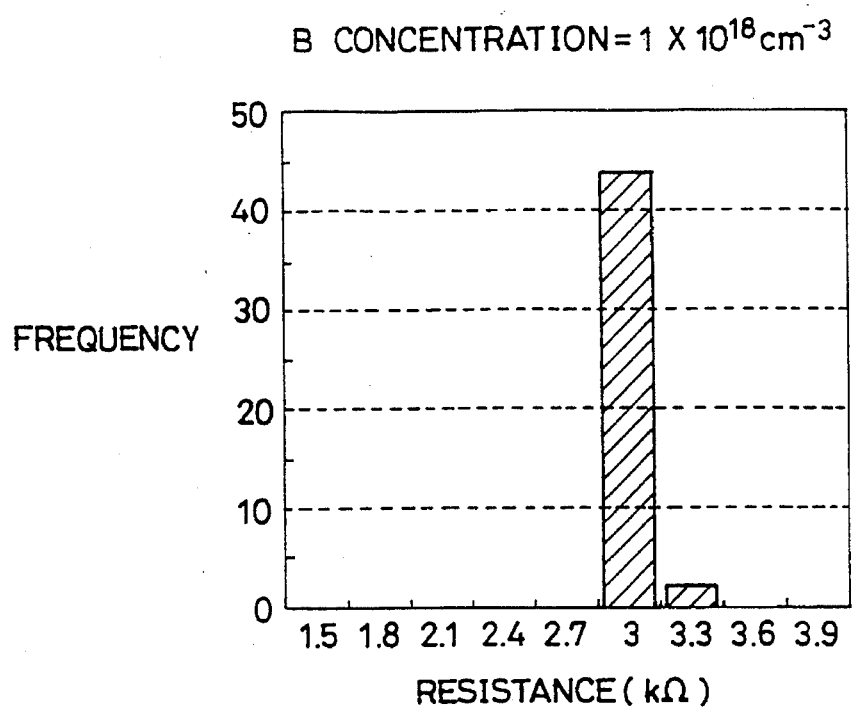
FIG. 10 is a distribution diagram showing distribution resistance value of a piezo resistance, having crystal sub-grain boundaries therein, with impurity concentration of $1 \times 10^{18}$ cm$^{-3}$.
Figure 11:
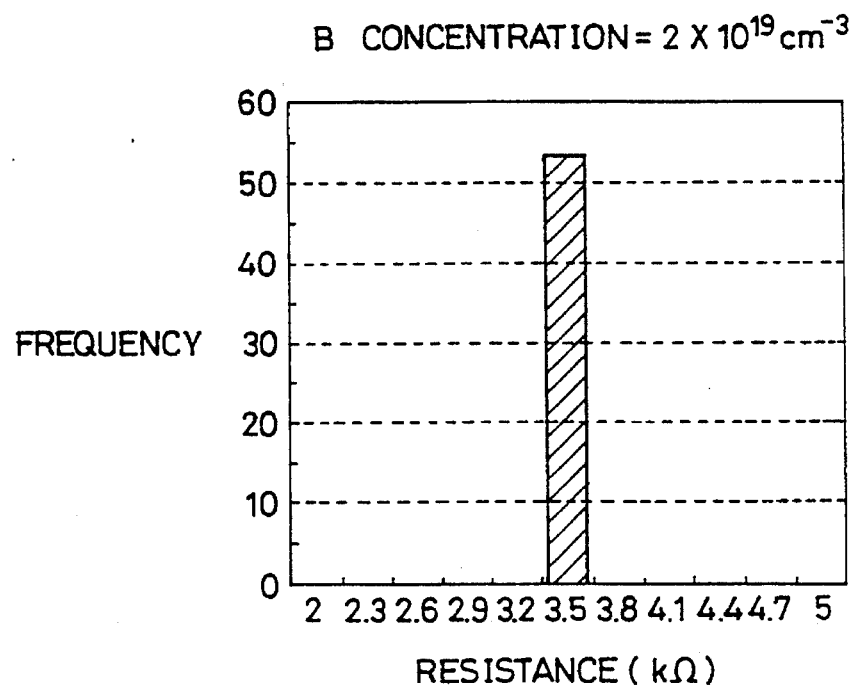
FIG. 11 is a distribution diagram showing distribution in resistance value of a piezo resistance, having crystal sub-grain boundaries therein, with impurity concentration of $2 \times 10^{19}$ cm$^{-3}$.
Figure 12:
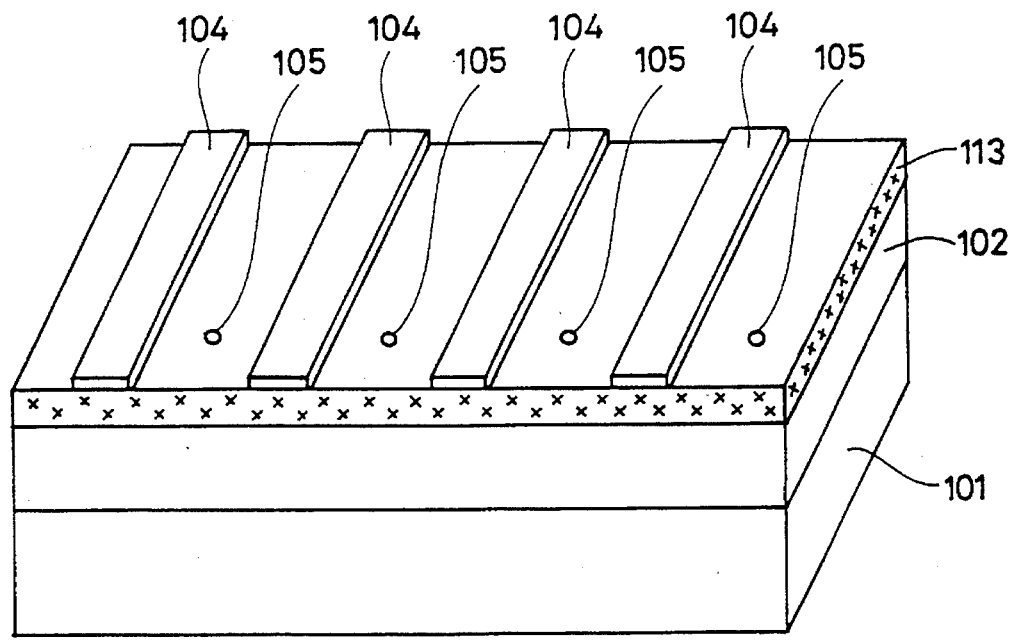
FIG. 12 is a fragmented perspective view for illustrating conventional laser recrystallization using antireflection films.
Figure 13:
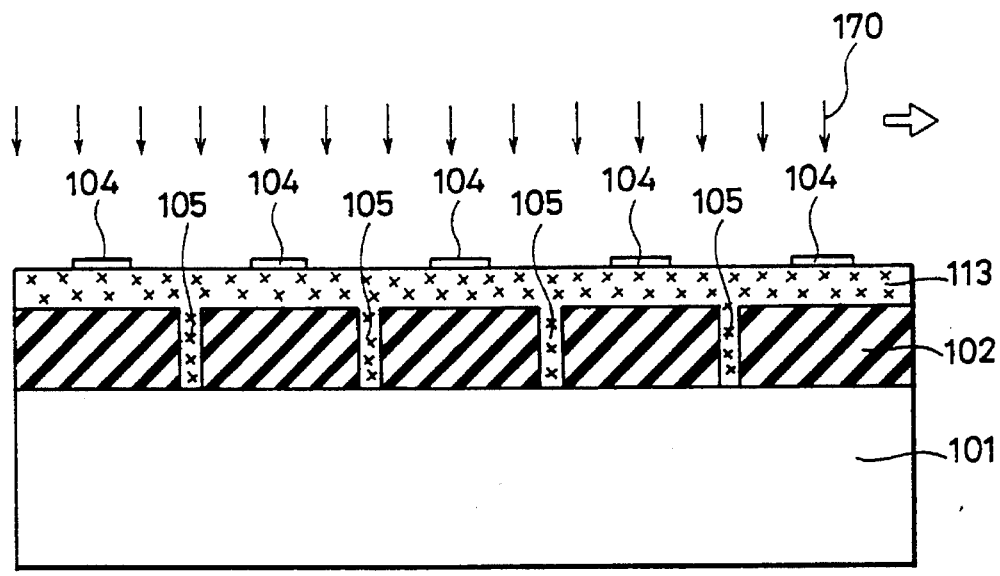
FIG. 13 a sectional view for illustrating a first step of the conventional laser recrystallization using antireflection films.
Figure 14:
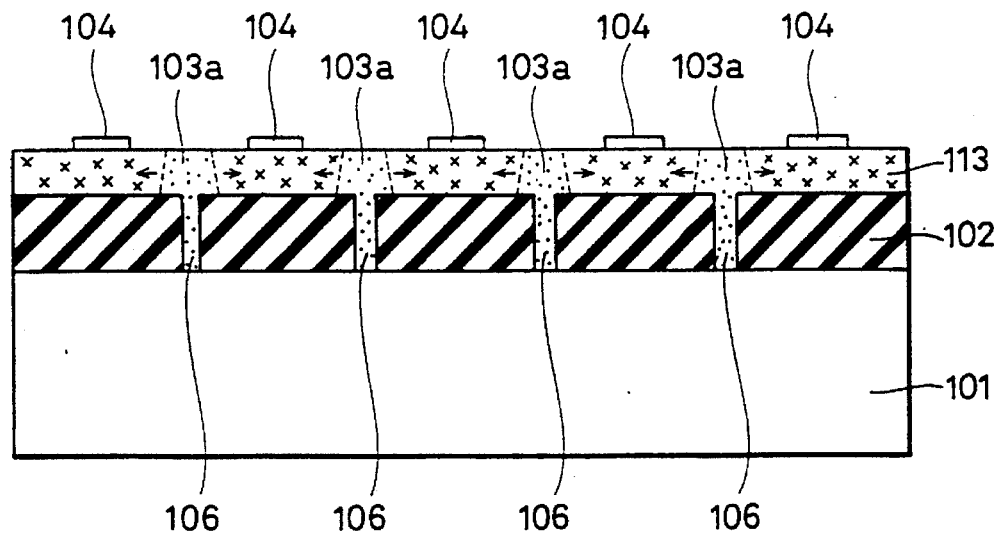
FIG. 14 is a sectional view for illustrating a second step of the conventional laser recrystallization using antireflection films.
Figure 15:
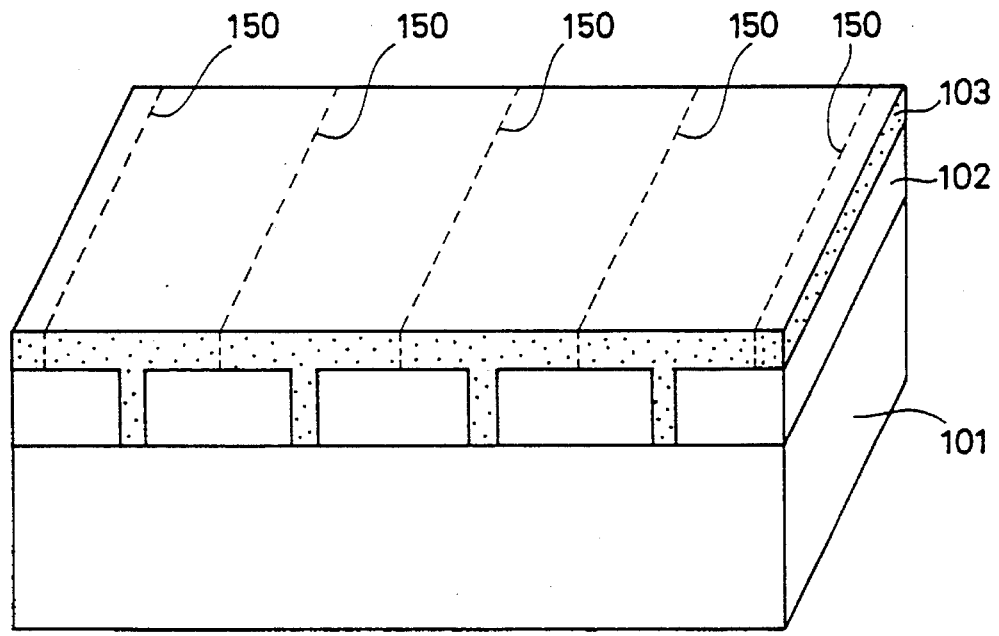
FIG. 15 is a fragmented perspective view for illustrating a third step of the conventional laser recrystallization using antireflection films.
Figure 16:
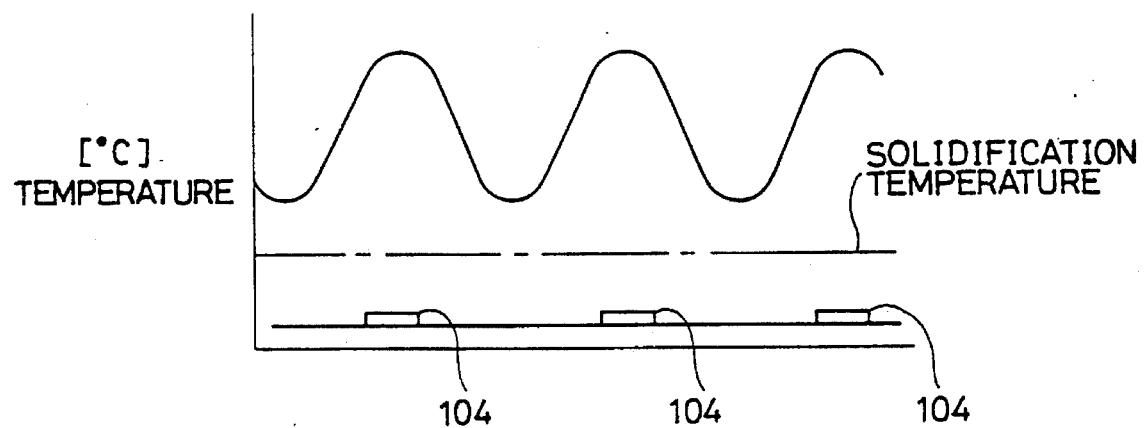
FIG. 16 is a temperature distribution diagram showing relations between surface temperatures and internal temperatures of a polycrystalline silicon layer.

According to a fourth embodiment of the present invention as shown in FIG. 7, crystal sub-grain boundaries 51 are contained in a piezo resistance 36, similarly to the third embodiment shown in FIG. 6. The crystal sub-grain boundaries 51 are so present in the piezo resistance 34 as not to traverse a current path connecting two contact holes 36 of the piezo resistance 34 with each other. Thus, it is possible to effectively prevent electric conduction of the piezo resistance 34 from inhibition by potential barriers formed by the crystal sub-grain boundaries 51. Consequently, the piezo resistance 34 can be set at a higher resistance temperature coefficient as compared with the prior art, whereby it is possible to provide a semiconductor pressure sensor which is capable of carrying out temperature compensation in high accuracy by excitation voltage compensation. According to the fourth embodiment of the present invention, the current flows along the <110> direction in the piezo resistance 34. Therefore, a p-type impurity such as boron is introduced into the piezo resistance 34 in order to convert the same to p-type silicon, similarly to the second embodiment shown in FIG. 5. Thus, it is possible to maximize the piezoresistance effect.

FIGS. 8 to 11 are distribution diagrams for illustrating a semiconductor pressure sensor according to a fifth embodiment of the present invention. Namely, FIGS. 8 to 11 illustrate relations between impurity concentration values and resistance values of piezo resistances containing crystal sub-grain boundaries. Referring to FIGS. 8 to 11, boron (B) is employed as impurities. FIGS. 8 to 11 show resistances values of piezo resistances having boron concentration values of $2\times10^{17}$ cm$^{-3}$, $4\times10^{17}$cm$^{-3}$, $1\times10^{18}$cm$^{-3}$ and $2\times10^{19}$ cm$^{-3}$ respectively. As hereinabove described, a potential barrier is increased when impurity concentration of a piezo resistance is reduced, to increase its resistance value. When the potential barrier is thus increased, dispersion of such potential barrier is also increased by dispersion in crystal defect density, and hence dispersion in resistance value, of the piezo resistance is also increased. In a piezo resistance containing a crystal sub-grain boundary therein, dispersion in resistance value is increased as its impurity concentration is reduced.

It is assumed that fluctuation (dispersion) within 10% is allowed with respect to the minimum resistance value. Consider a non-defective yield (non-defective percentage) on the assumption that products within this allowance range are regarded as non-defectives. Referring to FIGS. 8 to 11, samples of piezo resistances having impurity concentration values of $2\times10^{17}$ cm$^{-3}$, $4\times10^{17}$ cm$^{-3}$, $1\times10^{18}$ cm$^{-3}$ and $2\times10^{19}$ cm$^{-3}$ respectively exhibited non-defective percentages of 23%, 74%, 98% and up to 100% respectively. These values were obtained as to single piezo resistances respectively. As to semiconductor pressure sensors of the type shown in FIG. 17, therefore, it is necessary to consider non-defective percentages of quaternary piezo resistances. Namely, non-defective percentages of such semiconductor pressure sensors are 0.3%, 30%, 92% and up to 100% with respect to impurity concentration values of $2\times10^{17}$ cm$^{-3}$, $4\times10^{17}$ cm$^{-3}$, $1\times10^{18}$ cm$^{-3}$ and $2\times10^{19}$ cm$^{-3}$ respectively. Consequently, it has been proved that semiconductor pressure sensors can be fabricated at a certain degree of non-defective percentage when impurity concentration of piezo resistances is set to be at least $4\times10^{17}$ cm$^{-3}$. Thus, it is possible to improve the non-defective percentage of semiconductor pressure sensors having piezo resistances of SOI structures by defining impurity concentration of the piezo resistances.

Although the piezo resistance is prepared from a single crystal layer of an SOI structure which is formed by laser recrystallization using an antireflection film in each of the aforementioned embodiments, the present invention is not restricted to this but is also applicable to a piezo resistance which is prepared from a single crystal layer of an SOI structure formed by other lateral seeding. Also when a single crystal layer of an SOI structure is formed by other lateral seeding, a problem similar to that of a single crystal layer formed by laser recrystallization is caused by a crystal sub-grain boundary. In this case, therefore, the aforementioned embodiments are applicable.

While each of the embodiments of the present invention has been described with reference to a semiconductor pressure sensor having an SOI structure formed by laser recrystallization, the present invention is not restricted to this but is also applicable to another semiconductor device, such as a semiconductor acceleration sensor, for example, having a similar structure.

In a semiconductor device according to one embodiment of the present invention, a piezo resistance layer, having piezo characteristics, consisting of a single crystal layer which is formed by laterally growing single crystals from a seed crystal region on an insulating layer is so formed as to contain no crystal sub-grain boundary therein, whereby electric conduction of the piezo resistance layer is not inhibited by a potential barrier formed by the crystal sub-grain boundary and the resistance temperature coefficient of the piezo resistance layer is not reduced. Consequently, it is possible to set the piezo resistance layer at a high resistance temperature coefficient, to enable temperature compensation of high accuracy carried out by excitation voltage compensation.

In a semiconductor device according to another embodiment of the present invention, a piezo resistance layer, having piezo characteristics, consisting of a single crystal layer which is formed by laterally growing single crystals from a seed crystal region on an insulating layer is so formed that a crystal sub-grain boundary is contained therein and its current path will not traverse the crystal sub-grain boundary, whereby electric conduction of the piezo resistance layer is effectively prevented from inhibition by a potential barrier formed by the crystal sub-grain boundary. Thus, it is possible to effectively prevent the resistance temperature coefficient of the piezo resistance layer from reduction, dissimilarly to the prior art. Consequently, the piezo resistance can be set at a high resistance temperature coefficient, whereby it is possible to provide a semiconductor device which is capable of carrying out temperature compensation in high accuracy by excitation voltage compensation.

In a semiconductor device according to still another embodiment of the present invention, a piezo resistance layer, having piezo characteristics, consisting of a single crystal layer which is formed by laterally growing single crystals from a seed crystal region on an insulating layer contains a crystal sub-grain boundary therein while its impurity concentration is set to be at least $4 \times 10^{17}$ cm$^{-3}$, whereby a piezoresistance effect can be improved while suppressing dispersion in resistance value of the piezo resistance layer to some extent. Further, it is possible to fabricate such a semiconductor device at a high non-defective percentage.

In a method of fabricating a semiconductor device according to an embodiment of the present invention, an insulating layer is formed on a single crystal semiconductor substrate having a seed crystal region, single crystals are laterally grown from the seed crystal region on the insulating layer thereby forming a single crystal layer, and a piezo resistance layer is formed on a region of the single crystal layer having no crystal sub-grain boundary, whereby electric conduction of the piezo resistance layer is not inhibited by a potential barrier formed by the crystal sub-grain boundary dissimilarly to the prior art, and the resistance temperature coefficient of the piezo resistance layer is not reduced. Consequently, it is possible to set the piezo resistance layer at a high resistance temperature coefficient. Thus, it is possible to easily fabricate a semiconductor device which is capable of carrying out temperature compensation in high accuracy by excitation voltage compensation.

In a method of fabricating a semiconductor device according to another embodiment of the present invention, an insulating layer is formed on a single crystal semiconductor substrate having a seed crystal region, single crystals are laterally grown from the seed crystal region on the insulating layer to form a single crystal layer, and a piezo resistance layer is formed on a region of the single crystal layer containing a crystal sub-grain boundary so that the crystal sub-grain boundary will not traverse its current path, whereby electric conduction of the piezo resistance layer is effectively prevented from inhibition by a potential barrier formed by the crystal sub-grain boundary contained in the piezo resistance layer. Thus, the piezo resistance layer can be set at a high resistance temperature coefficient. Consequently, it is possible to easily fabricate a semiconductor device which is capable of carrying out temperature compensation in high accuracy by excitation voltage compensation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a single crystal semiconductor substrate having a seed crystal region;
   an insulating layer being formed on said single crystal semiconductor substrate; and
   a piezo resistance layer, having piezo characteristics, consisting of a single crystal layer being formed by laterally growing single crystals from said seed crystal region on said insulating layer,
   said piezo resistance layer being so formed as to have one or more crystal sub-grain boundaries therein, and contacts which define a current path therebetween, said contacts being selectively positioned so that any portion of the current path is not traversed by any crystal sub-grain boundary in said piezo resistance layer.

2. A semiconductor device in accordance with claim 1, wherein
   said single crystal semiconductor substrate is a single crystal silicon substrate having a major surface of a (100) plane,
   a current direction of said piezo resistance layer being along the <100> direction.

3. A semiconductor device in accordance with claim 1, wherein
   said single crystal semiconductor substrate is a single crystal silicon substrate having a major surface of a (100) plane,
   a current direction of said piezo resistance layer being along the <110> direction.

4. A semiconductor device in accordance with claim 1, wherein said crystal sub-grain boundary is formed along the <100> direction, said piezo resistance layer being so formed as to extend along the <100> direction.

5. A semiconductor device in accordance with claim 1, wherein said crystal sub-grain boundary is formed along the <100> direction, said piezo resistance layer being so formed as to extend along the <110> direction.

6. A semiconductor device in accordance with claim 1, wherein said piezo resistance layer is set to be at least $4 \times 10^{17}$ cm$^{-3}$ in impurity concentration.

7. A semiconductor device comprising:

a single crystal semiconductor substrate having a seed crystal region;

an insulating layer being formed on said single crystal semiconductor region; and a piezo resistance layer, having piezo characteristics, consisting of a single crystal layer being formed by laterally growing single crystals from said seed crystal region on said insulating layer, said piezo resistance layer being so formed as to have one or more crystal sub-grain boundaries therein directed in the same direction as the current flow path in the piezo resistance layer.

8. A semiconductor device in accordance with claim 7, wherein said single crystal semiconductor substrate is a single crystal silicon substrate having a major surface of a (100) plane, a current direction of said piezo resistance layer being along the <100> direction.

9. A semiconductor device in accordance with claim 7, wherein said crystal sub-grain boundary is formed along the <100> direction, said piezo resistance layer being so formed as to extend along the <100> direction.

10. A semiconductor device in accordance with claim 7, wherein said piezo resistance layer is set to be at least $4 \times 10^{17}$ cm$^{-3}$ in impurity concentration.

11. A semiconductor device comprising:

a single crystal semiconductor substrate having a seed crystal region;

an insulating layer being formed on said single crystal semiconductor substrate; and a piezo resistance layer, having piezo characteristics, including a pair of contact regions positioned at ends thereof, respectively, and consisting of a single crystal layer having subgrain boundaries only at the ends of the current path between said pair of contact regions.

* * * * *